(12) United States Patent
Kang

(10) Patent No.: US 12,556,186 B2
(45) Date of Patent: Feb. 17, 2026

(54) CLOCK MULTIPLEXING CIRCUIT, CLOCK DISTRIBUTION CIRCUIT, AND SEMICONDUCTOR APPARATUS INCLUDING THE CLOCK MULTIPLEXING CIRCUIT

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 488 days.

(21) Appl. No.: 18/320,692

(22) Filed: May 19, 2023

(65) Prior Publication Data

US 2024/0243747 A1 Jul. 18, 2024

(30) Foreign Application Priority Data

Jan. 18, 2023 (KR) .................. 10-2023-0007275

(51) Int. Cl.
*H03K 19/173* (2006.01)
*H03K 19/0185* (2006.01)
*H03K 19/096* (2006.01)

(52) U.S. Cl.
CPC . *H03K 19/1737* (2013.01); *H03K 19/018521* (2013.01); *H03K 19/0963* (2013.01)

(58) Field of Classification Search
None
See application file for complete search history.

(56) References Cited

U.S. PATENT DOCUMENTS

| | | |
|---|---|---|
| 6,614,291 B1 | 9/2003 | Zhao et al. |
| 7,551,499 B2 | 6/2009 | Lee |
| 8,000,166 B2 | 8/2011 | Kim et al. |
| 10,074,437 B2 | 9/2018 | Keh et al. |
| 12,057,847 B2 * | 8/2024 | Song ..................... H03L 7/0816 |
| 2024/0203469 A1 * | 6/2024 | Kang .................. G11C 7/1057 |

* cited by examiner

*Primary Examiner* — Jany Richardson
(74) *Attorney, Agent, or Firm* — WILLIAM PARK AND ASSOCIATES LTD.

(57) ABSTRACT

A clock multiplexing circuit includes: a mode control unit configured to generate first enable signals and second enable signals in response to mode control signals; a first multiplexing unit configured to convert first input signals having a current mode logic (CML) level into complementary metal-oxide semiconductor (CMOS) level-signals in response to activation of the first enable signals, and to output the CMOS level-signals; and a second multiplexing unit configured to buffer and output second input signals having the CMOS level in response to the first enable signals and the second enable signals.

16 Claims, 10 Drawing Sheets

CLOCK MULTIPLEXING CIRCUIT, CLOCK DISTRIBUTION CIRCUIT, AND SEMICONDUCTOR APPARATUS INCLUDING THE CLOCK MULTIPLEXING CIRCUIT

CROSS-REFERENCES TO RELATED APPLICATION

The present application claims priority under 35 U.S.C. § 119(a) to Korean application number 10-2023-0007275, filed on Jan. 18, 2023, in the Korean Intellectual Property Office, which is incorporated herein by reference in its entirety.

BACKGROUND

1. Technical Field

The present disclosure generally relates to a semiconductor circuit, and more particularly, to a clock multiplexing circuit, a clock distribution circuit, and a semiconductor apparatus including the clock multiplexing circuit.

2. Related Art

A semiconductor apparatus includes a clock distribution circuit for distributing external clock signals, for example, clock signals provided by a host, to various circuit configurations inside the semiconductor apparatus.

The clock distribution circuit needs to receive the external clock signals, process the external clock signals in a form required for input/output terminals, and then distribute the processed signals to the respective input/output terminals, resulting in an increase in circuit area, an increase in power consumption, a reduction in signal processing efficiency, or the like. Therefore, it is necessary to develop a technology for solving the above problems.

SUMMARY

A clock multiplexing circuit in accordance with an embodiment of the present disclosure may include: a mode control unit configured to generate first enable signals and second enable signals in response to mode control signals; a first multiplexing unit configured to convert first input signals having a current mode logic (CML) level into complementary metal-oxide semiconductor (CMOS) level-signals in response to activation of the first enable signals, and to output the CMOS level-signals; and a second multiplexing unit configured to buffer and output second input signals having the CMOS level in response to the first enable signals and the second enable signals.

A clock distribution circuit in accordance with an embodiment of the present disclosure may include: a first clock processing circuit configured to divide and output first external clock signals when mode control signals have a value defining a first mode; a second clock processing circuit configured to multiply and output the first external clock signals and second external clock signals when the mode control signals have a value defining a second mode; and a clock multiplexing circuit configured to convert the output of the first clock processing circuit into a complementary metal-oxide semiconductor (CMOS) level-signals and output the CMOS level-signals when the mode control signals have the value defining the first mode, and to buffer and output the output of the second clock processing circuit when the mode control signals have the value defining the second mode.

A semiconductor apparatus in accordance with an embodiment of the present disclosure may include: a plurality of input and output (input/output) terminals configured to transmit and receive data according to multiphase clock signals; a global clock distribution circuit configured to convert first preliminary multiphase clock signals, which are generated by dividing first external clock signals, into and output the complementary metal-oxide semiconductor (CMOS) level-signals when mode control signals have a value defining a first mode, and to buffer and output second preliminary multiphase clock signals generated by multiplying the first external clock signals and second external clock signals when the mode control signals have a value defining a second mode; and a local clock distribution circuit configured to distribute, as the multiphase clock signals, the first preliminary multiphase clock signals and the second preliminary multiphase clock signals to the plurality of input/output terminals.

DETAILED DESCRIPTION

Hereinafter, embodiments of the present technology are described in more detail with reference to the accompanying drawings. The word "predetermined" as used herein with respect to a parameter, such as a predetermined level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Various embodiments are directed to providing a clock multiplexing circuit capable of reducing a circuit area and improving signal processing efficiency, a clock distribution circuit, and a semiconductor apparatus including the clock multiplexing circuit.

Figure 1:
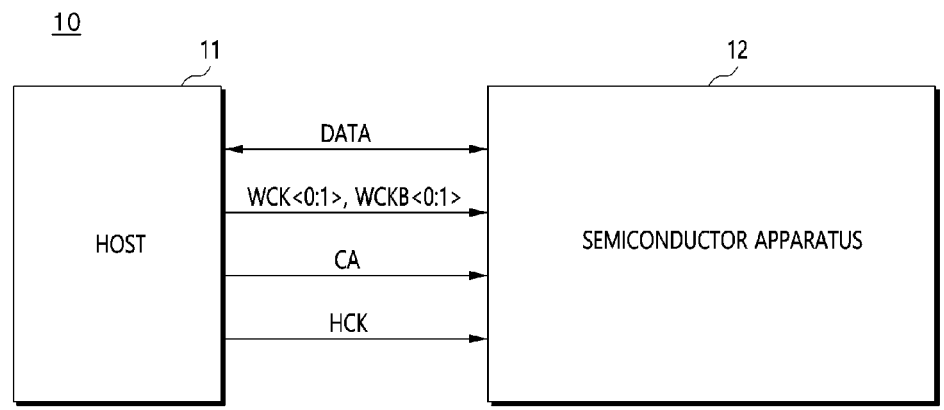
FIG. 1 is a diagram illustrating the configuration of a data processing system in accordance with an embodiment of the present disclosure.

FIG. 1 is a diagram illustrating the configuration of a data processing system 10 in accordance with an embodiment of the present disclosure.

Referring to FIG. 1, the data processing system 10 in accordance with an embodiment of the present disclosure may include a host 11 and a semiconductor apparatus 12.

The host 11 may provide the semiconductor apparatus 12 with clock signals HCK, WCK0, WCKB0, WCK1, and WCKB1, a command, and an address signal CA, and exchange data DATA with the semiconductor apparatus 12. Hereinafter, the clock signals HCK, WCK0, WCKB0, WCK1, and WCKB1 will be referred to as external clock signals based on the semiconductor apparatus 12.

The external clock signal HCK may be a clock signal related to the command and the address signal CA, and may be used as a reference signal when the semiconductor apparatus 12 receives the command and the address signal CA. The external clock signals WCK0, WCKB0, WCK1, and WCKB1 may be clock signals related to the data DATA, and may be used as reference signals when the semiconductor apparatus 12 receives the data DATA.

The host 11 may be, for example, a memory controller or test equipment such as a central processing unit (CPU) or a graphic processing unit (GPU). During a normal operation of the semiconductor apparatus 12, the host 11 may provide the external clock signals WCK0, WCKB0, WCK1, and WCKB1 each having a current mode logic (CML) level, and during a test operation thereof, the host 11 may provide the external clock signals WCK0, WCKB0, WCK1, and WCKB1 each having a complementary metal-oxide semiconductor (CMOS) level corresponding to a relatively low frequency compared to the normal operation. The CMOS level may mean that a corresponding signal fully swings from a ground terminal level to a power supply terminal level, and the range of signal level fluctuations at the CML level may be smaller than the range of signal level fluctuations at the CMOS level.

The semiconductor apparatus 12 may be, for example, a memory apparatus. The semiconductor apparatus 12 may transfer the data DATA to the host 11 or receive the data DATA from the host 11 according to the command and address signal CA, and the external clock signals HCK, WCK0, WCKB0, WCK1, and WCKB1.

Figure 2:
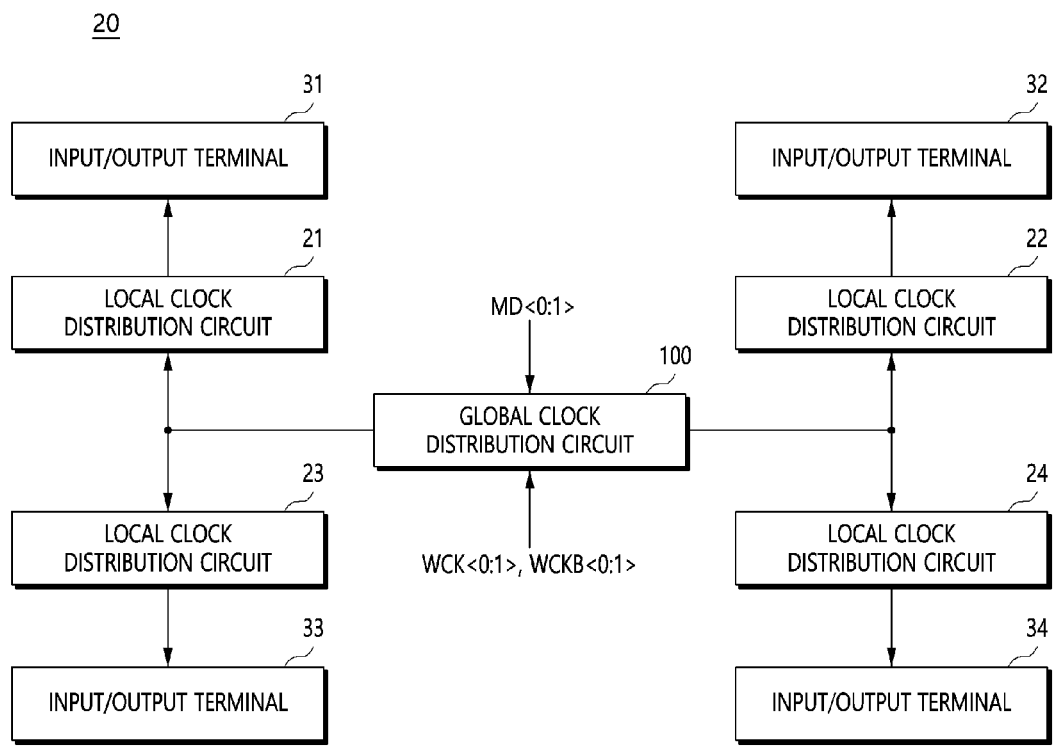
FIG. 2 is a diagram illustrating the configuration of a semiconductor apparatus in accordance with an embodiment of the present disclosure.

FIG. 2 is a diagram illustrating the configuration of a semiconductor apparatus 20 in accordance with an embodiment of the present disclosure.

Referring to FIG. 2, the semiconductor apparatus 20 in accordance with an embodiment of the present disclosure may include a global clock distribution circuit 100, a plurality of local clock distribution circuits 21 to 24, and a plurality of input/output terminals 31 to 34.

The global clock distribution circuit 100 may receive mode control signals MD<0:1> and external clock signals WCK0, WCKB0, WCK1, and WCKB1, and provide a plurality of multiphase clock signals to the plurality of local clock distribution circuits 21 to 24. Hereinafter, a pair of signals WCK0 and WCKB0 having a differential relationship will be referred to as first external clock signals, and another pair of signals WCK1 and WCKB1 having a differential relationship will be referred to as second external clock signals.

When the mode control signals MD<0:1> each have a value defining a first mode, the global clock distribution circuit 100 may convert first preliminary multiphase clock signals generated by dividing the first external clock signals WCK0 and WCKB0 into CMOS level-signals and output the CMOS level-signals. When the mode control signals MD<0:1> each have a value defining a second mode, the global clock distribution circuit 100 may buffer and output second preliminary multiphase clock signals generated by multiplying the first external clock signals WCK0 and WCKB0 and the second external clock signals WCK1 and WCKB1. The global clock distribution circuit 100 may be deactivated when the mode control signals MD<0:1> each have the value defining the first mode.

The first mode may be an operation mode for a normal operation of the semiconductor apparatus 20, and the second mode may be an operation mode for a test operation of the semiconductor apparatus 20. During the normal operation of the semiconductor apparatus 20, because the first external clock signals WCK0 and WCKB0 and the second external clock signals WCK1 and WCKB1 each having a high frequency are provided and enable a high-speed operation of the semiconductor apparatus 20, the first mode will be referred to as a high-speed mode. During the test operation of the semiconductor apparatus 20, because the first external clock signals WCK0 and WCKB0 and the second external clock signals WCK1 and WCKB1 each having a frequency lower than that in the normal operation are provided and enable a low-power operation of the semiconductor apparatus 20, the second mode will be referred to as a low-power mode. A power-down mode of the semiconductor apparatus 20 will be referred to as a third mode.

The plurality of local clock distribution circuits 21 to 24 may distribute, as multiphase clock signals, the first preliminary multiphase clock signals and the second preliminary multiphase clock signals to the plurality of input/output terminals 31 to 34. The plurality of local clock distribution circuits 21 to 24 may be configured identically to one another.

The plurality of input/output terminals 31 to 34 may transmit and receive data according to the multiphase clock signals. The plurality of input/output terminals 31 to 34 may be configured identically to one another. Each of the plurality of input/output terminals 31 to 34 may include a DQ pad, that is, an input/output pad (not illustrated) and a transmission/reception circuit (not illustrated).

Figure 3:
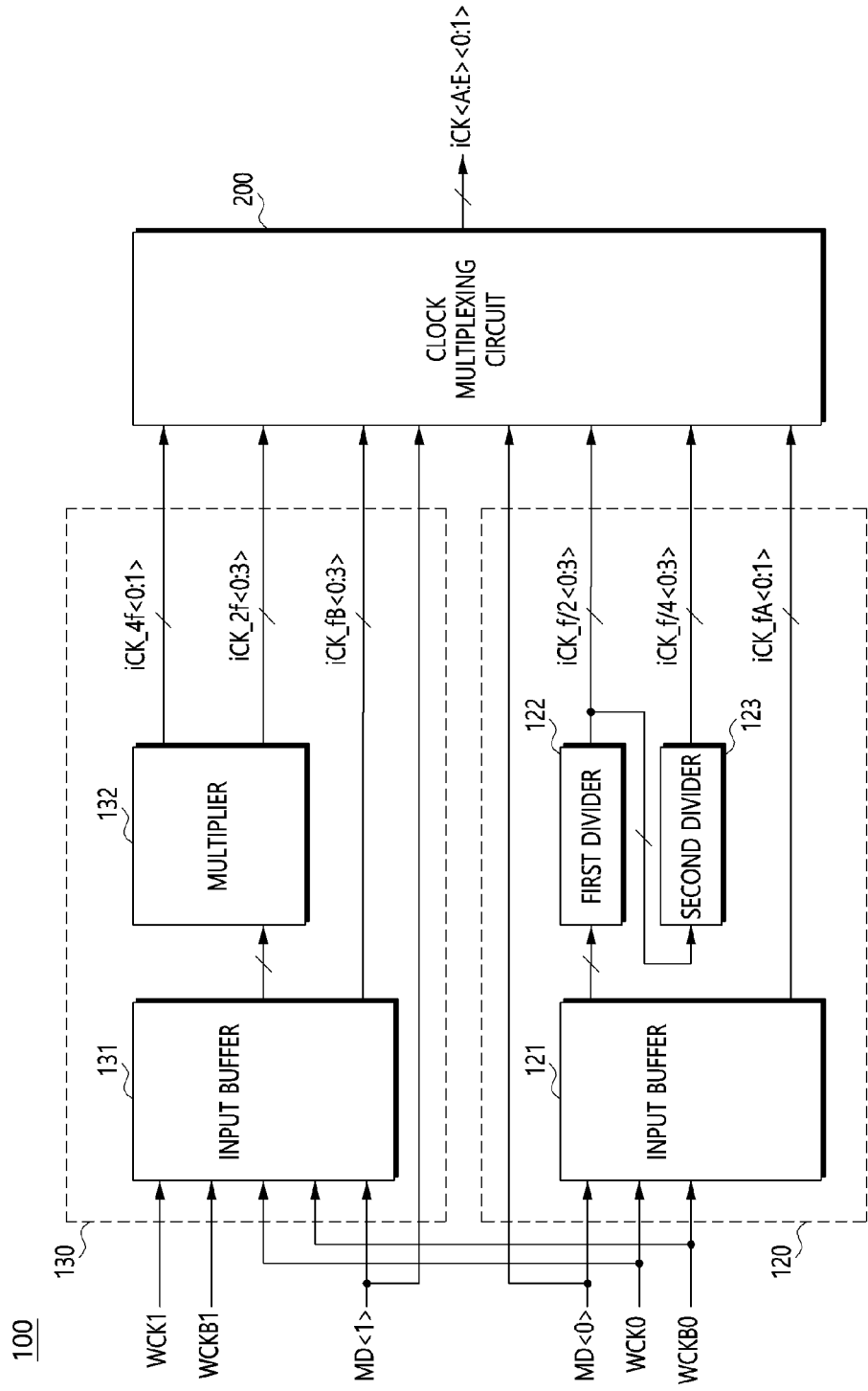
FIG. 3 is a diagram illustrating the configuration of a global clock distribution circuit of FIG. 2.

FIG. 3 is a diagram illustrating the configuration of the global clock distribution circuit 100 of FIG. 2.

Referring to FIG. 3, the global clock distribution circuit 100 may include a first clock processing circuit 120, a second clock processing circuit 130, and a clock multiplexing circuit 200.

The first clock processing circuit 120 may receive the first external clock signals WCK0 and WCKB0 and the mode control signal MD<0>, and output first preliminary multiphase clock signals iCK_fA<0:1>, iCK_f/2<0:3>, and iCK_f/4<0:3>.

When the mode control signals MD<0:1> each have the value defining the first mode, that is, when the signal bit MD<0> of the mode control signals MD<0:1> has a high level, the first clock processing circuit 120 may generate the first preliminary multiphase clock signals iCK_fA<0:1>, iCK_f/2<0:3>, and iCK_f/4<0:3> by dividing the first external clock signals WCK0 and WCKB0.

The first clock processing circuit 120 may include an input buffer 121, a first divider 122, and a second divider 123. When the signal bit MD<0> has a high level, the input buffer 121 may be activated to receive the first external clock signals WCK0 and WCKB0, and buffer and output the received signals. The first external clock signals WCK0 and WCKB0 may be buffered by the input buffer 121 and output as the first preliminary multiphase clock signals iCK_fA<0:1>. The first divider 122 may divide by two the output of the input buffer 121 and output the first preliminary multiphase clock signals iCK_f/2<0:3>. The second divider 123 may divide by two the first preliminary multiphase clock signals iCK_f/2<0:3> and output the first preliminary multiphase clock signals iCK_f/4<0:3>.

The second clock processing circuit 130 may receive the first external clock signals WCK0 and WCKB0, the second external clock signals WCK1 and WCKB1, and the mode control signal MD<1>, and output second preliminary multiphase clock signals iCK_fB<0:3>, iCK_2f<0:3>, and iCK_4f<0:1>.

When the mode control signals MD<0:1> each have the value defining the second mode, that is, when the signal bit MD<1> of the mode control signals MD<0:1> has a high level, the second clock processing circuit 130 may generate the second preliminary multiphase clock signals iCK_fB<0:3>, iCK_2f<0:3>, and iCK_4f<0:1> by multiplying the first external clock signals WCK0 and WCKB0 and the second external clock signals WCK1 and WCKB1.

The second clock processing circuit 130 may include an input buffer 131 and a multiplier 132. When the signal bit MD<1> has a high level, the input buffer 131 may be activated to receive the first external clock signals WCK0 and WCKB0 and the second external clock signals WCK1 and WCKB1, and may buffer and output the received signals. The first external clock signals WCK0 and WCKB0 and the second external clock signals WCK1 and WCKB1 may be buffered by the input buffer 131 and output as the second preliminary multiphase clock signals iCK_fB<0:3>.

The clock multiplexing circuit 200 may receive the mode control signals MD<0:1>, the first preliminary multiphase clock signals iCK_fA<0:1>, iCK_f/2<0:3>, and iCK_f/4<0:3>, and the second preliminary multiphase clock signals iCK_fB<0:3>, iCK_2f<0:3>, and iCK_4f<0:1>, and output multiphase clock signals iCK<A:E><0:1>.

The clock multiplexing circuit 200 may multiplex and output the first preliminary multiphase clock signals iCK_fA<0:1>, iCK_f/2<0:3>, and iCK_f/4<0:3>, and the second preliminary multiphase clock signals iCK_fB<0:3>, iCK_2f<0:3>, and iCK_4f<0:1> according to the mode control signals MD<0:1>. When the mode control signals MD<0:1> each have the value defining the first mode, the clock multiplexing circuit 200 may convert the first preliminary multiphase clock signals iCK_fA<0:1>, iCK_f/2<0:3>, and iCK_f/4<0:3> into CMOS level-signals and output the CMOS level-signals. When mode control signals MD<0:1> each have the value defining the second mode, the clock multiplexing circuit 200 may buffer and output the second preliminary multiphase clock signals iCK_fB<0:3>, iCK_2f<0:3>, and iCK_4f<0:1>.

The embodiment of the present disclosure may use the clock multiplexing circuit 200 to select only clock signals matching a current mode from the first preliminary multiphase clock signals iCK_fA<0:1>, iCK_f/2<0:3>, and iCK_f/4<0:3> and the second preliminary multiphase clock signals iCK_fB<0:3>, iCK_2f<0:3>, and iCK_4f<0:1>, and transmit the selected clock signals to the local clock distribution circuits. Consequently, in an embodiment, the number of transmission lines can be reduced compared to transmitting all clock signals. Furthermore, in an embodiment, because the clock multiplexing circuit 200 converts clock signals into CMOS level-signals and transmits the CMOS level-signals, the reliability of the transmitted clock signals can be improved.

Figure 4:
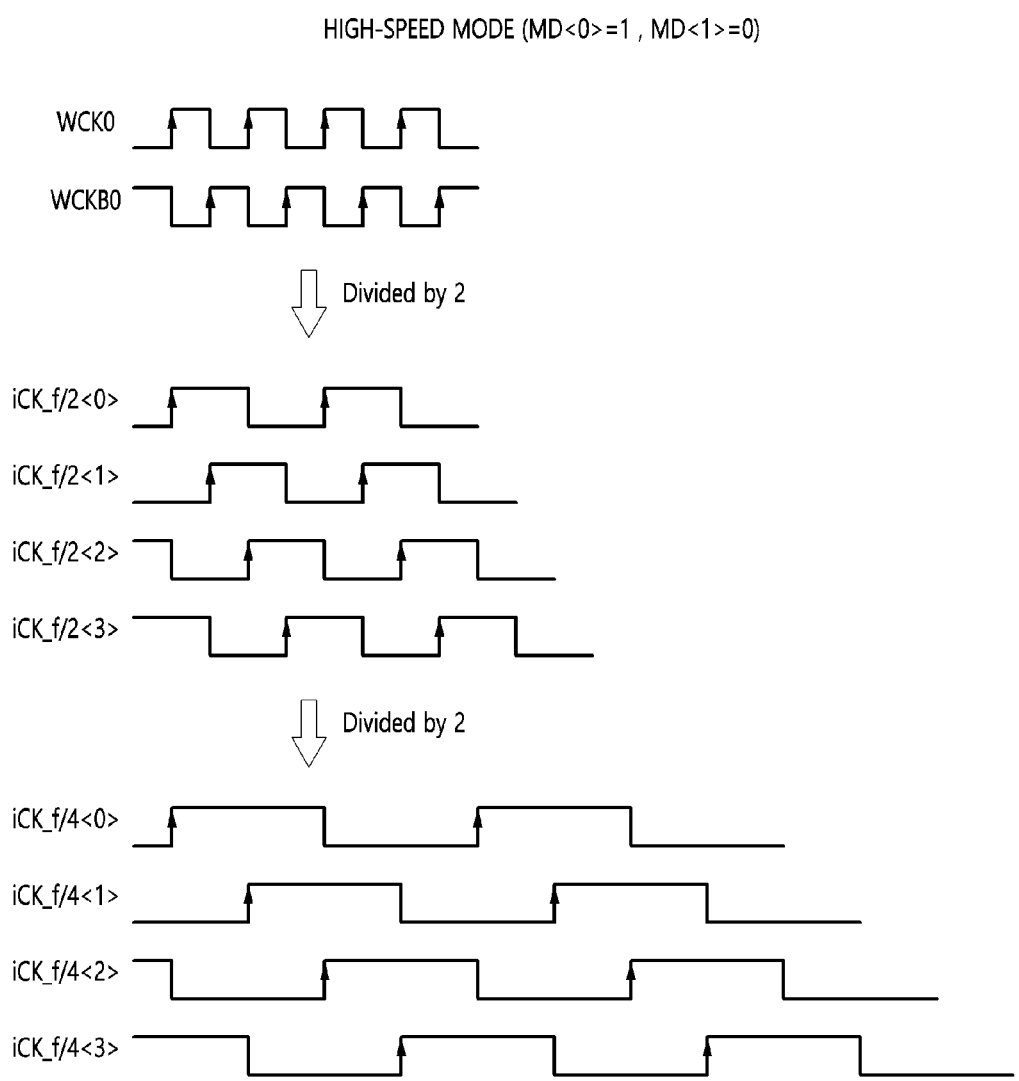
FIG. 4 is a diagram illustrating an operation of a first clock processing circuit of FIG. 3.

FIG. 4 is a diagram illustrating the operation of the first clock processing circuit 120 of FIG. 3.

Referring to FIG. 4, in the first mode, that is, in the high-speed mode, the first external clock signals WCK0 and WCKB0 having the CML level may be input and divided by two by the first divider 122, so that the first preliminary multiphase clock signals iCK_f/2<0:3> may be generated. The first preliminary multiphase clock signals iCK_f/2<0:3> are further divided by two by the second divider 123 and the first preliminary multiphase clock signals iCK_f/4<0:3> may be generated.

Figure 5:
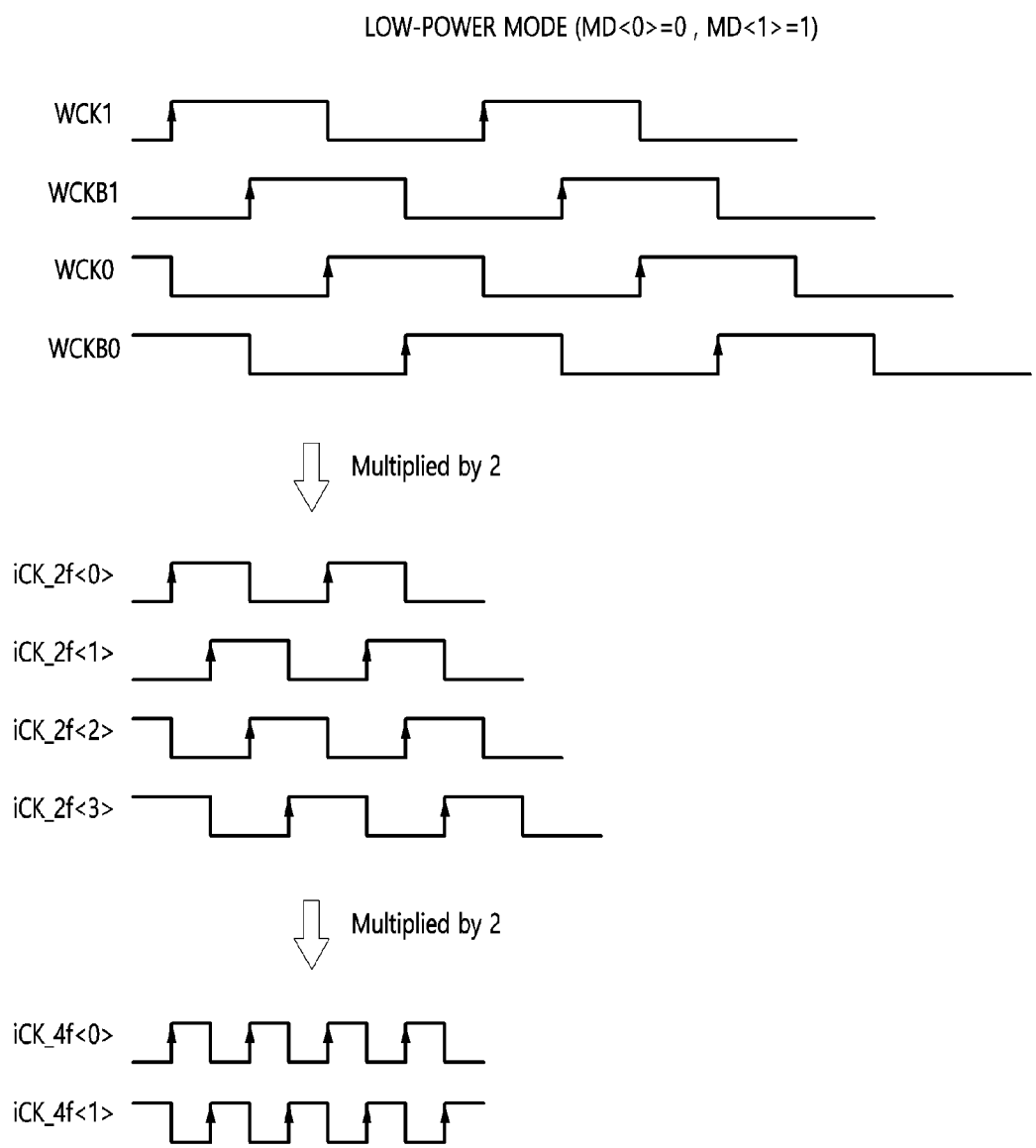
FIG. 5 is a diagram illustrating an operation of a second clock processing circuit of FIG. 3.

FIG. 5 is a diagram illustrating the operation of the second clock processing circuit 130 of FIG. 3.

Referring to FIG. 5, in the second mode, that is, the low-power mode, the first external clock signals WCK0 and WCKB0 and the second external clock signals WCK1 and WCKB1 having the CMOS level may be input and multiplied by two through the multiplier 132, so that the second preliminary multiphase clock signals iCK_2f<0:3> may be generated. The second preliminary multiphase clock signals iCK_2f<0:3> may be further multiplied by two through the multiplier 132 and the second preliminary multiphase clock signals iCK_4f<0:1> may be generated. The second preliminary multiphase clock signals iCK_2f<0:3> have four phases, but when these are multiplied by two, two phases may overlap, so the second preliminary multiphase clock signals iCK_4f<0:1> having two phases may be finally generated.

Figure 6:
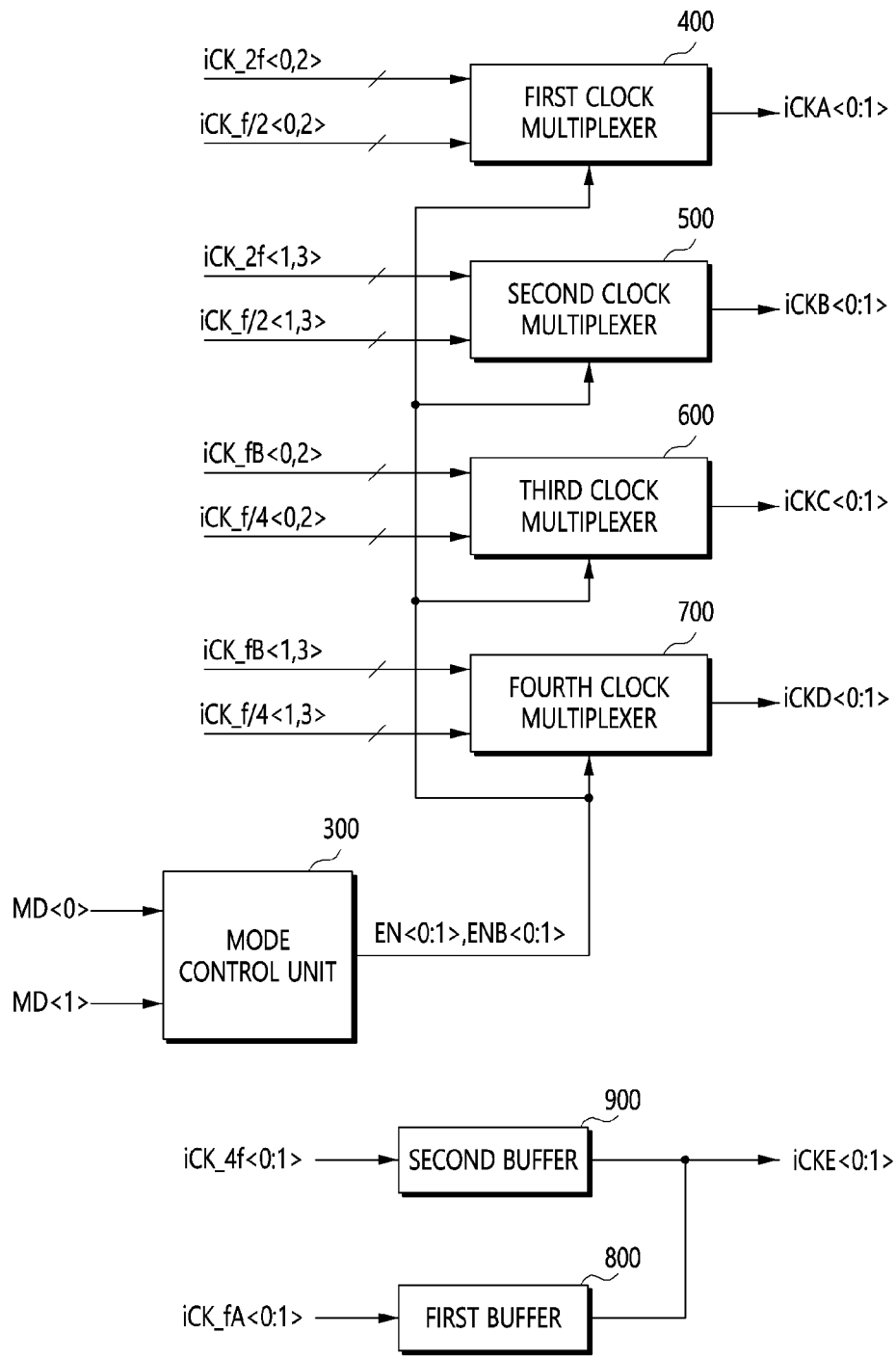
FIG. 6 is a diagram illustrating the configuration of a clock multiplexing circuit of FIG. 3.

FIG. 6 is a diagram illustrating the configuration of the clock multiplexing circuit 200 of FIG. 3.

Referring to FIG. 6, the clock multiplexing circuit 200 may include a mode control unit 300, a first clock multiplexer 400, a second clock multiplexer 500, a third clock multiplexer 600, a fourth clock multiplexer 700, a first buffer 800, and a second buffer 900.

The mode control unit 300 may receive the mode control signals MD<0:1> and output first enable signals EN0 and ENB0 and second enable signals EN1 and ENB1. When the mode control signals MD<0:1> each have a value defining the first mode (MD<0>=1, MD<1>=0), the mode control unit 300 may activate the first enable signals EN0 and ENB0 and deactivate the second enable signals EN1 and ENB1. When the mode control signals MD<0:1> each have a value defining the second mode (MD<0>=0, MD<1>=1), the mode control unit 300 may deactivate the first enable signals EN0 and ENB0 and activate the second enable signals EN1 and ENB1. When the mode control signals MD<0:1> each have a value defining the third mode (MD<0>=0, MD<1>=0), the mode control unit 300 may deactivate all the first enable signals EN0 and ENB0 and the second enable signals EN1 and ENB1.

The first clock multiplexer 400 may receive the first enable signals EN0 and ENB0, the second enable signals EN1 and ENB1, a part (for example, iCK_f/2<0, 2>) (hereinafter, referred to as first input signals) of one of the first preliminary multiphase clock signals iCK_fA<0:1>, iCK_f/2<0:3>, and iCK_f/4<0:3>, and a part (for example, iCK_2f/2<0, 2>) (hereinafter, referred to as second input signals) of one of the second preliminary multiphase clock signals iCK_fB<0:3>, iCK_2f<0:3>, and iCK_4f<0:1>, and output multiphase clock signals iCKA<0:1>.

The first clock multiplexer 400 may multiplex the first input signals iCK_f/2<0, 2> and the second input signals iCK_2f/2<0, 2> in response to the first enable signals EN0 and ENB0 and the second enable signals EN1 and ENB1, thereby generating the multiphase clock signals iCKA<0:1>.

When the first enable signals EN0 and ENB0 are activated out of the first enable signals EN0 and ENB0 and the second enable signals EN1 and ENB1, the first clock multiplexer 400 may convert the first input signals iCK_f/2<0, 2> into CMOS level-signals and output the CMOS level-signals as the multiphase clock signals iCKA<0:1>. When the second enable signals EN1 and ENB1 are activated out of the first enable signals EN0 and ENB0 and the second enable signals EN1 and ENB1, the first clock multiplexer 400 may buffer the second input signals iCK_2f/2<0, 2> and output the buffered signals as the multiphase clock signals iCKA<0:1>.

The second clock multiplexer 500 may receive the first enable signals EN0 and ENB0, the second enable signals EN1 and ENB1, the first input signals iCK_f/2<1, 3>, and the second input signals iCK_2f/2<1, 3>, and output multiphase clock signals iCKB<0:1>.

The second clock multiplexer 500 may multiplex the first input signals iCK_f/2<1, 3> and the second input signals iCK_2f/2<1, 3> in response to the first enable signals EN0 and ENB0 and the second enable signals EN1 and ENB1, thereby generating the multiphase clock signals iCKB<0:1>.

When the first enable signals EN0 and ENB0 are activated, the second clock multiplexer 500 may convert the first input signals iCK_f/2<1, 3> into CMOS level-signals, and output the CMOS level-signals as the multiphase clock signals iCKB<0:1>. When the second enable signals EN1 and ENB1 are activated, the second clock multiplexer 500 may buffer the second input signals iCK_2f/2<1, 3> and output the buffered signals as the multiphase clock signals iCKB<0:1>.

The third clock multiplexer 600 may receive the first enable signals EN0 and ENB0, the second enable signals EN1 and ENB1, the first input signals iCK_f/4<0, 2>, and the second input signals iCK_fB<0, 2>, and output multiphase clock signals iCKC<0:1>.

The third clock multiplexer 600 may multiplex the first input signals iCK_f/4<0, 2> and the second input signals iCK_fB<0, 2> in response to the first enable signals EN0 and ENB0 and the second enable signals EN1 and ENB1, thereby generating the multiphase clock signals iCKC<0:1>.

When the first enable signals EN0 and ENB0 are activated, the third clock multiplexer 600 may convert the first input signals iCK_f/4<0, 2> into CMOS level-signals, and output the CMOS level-signals as the multiphase clock signals iCKC<0:1>. When the second enable signals EN1 and ENB1 are activated, the third clock multiplexer 600 may buffer the second input signals iCK_fB<0, 2> and output the buffered signals as the multiphase clock signals iCKC<0:1>.

The fourth clock multiplexer 700 may receive the first enable signals EN0 and ENB0, the second enable signals EN1 and ENB1, the first input signals iCK_f/4<1, 3>, and the second input signals iCK_fB<1, 3>, and output multiphase clock signals iCKD<0:1>.

The fourth clock multiplexer 700 may multiplex the first input signals iCK_f/4<1, 3> and the second input signals iCK_fB<1, 3> in response to the first enable signals EN0 and ENB0 and the second enable signals EN1 and ENB1, thereby generating the multiphase clock signals iCKD<0:1>.

When the first enable signals EN0 and ENB0 are activated, the fourth clock multiplexer 700 may convert the first input signals iCK_f/4<1, 3> into CMOS level-signals, and output the CMOS level-signals as the multiphase clock signals iCKD<0:1>. When the second enable signals EN1 and ENB1 are activated, the fourth clock multiplexer 700 may buffer the second input signals iCK_fB<1, 3> and output the buffered signals as the multiphase clock signals iCKD<0:1>.

The first clock multiplexer 400, the second clock multiplexer 500, the third clock multiplexer 600, and the fourth clock multiplexer 700 may be configured identically to one another.

The first buffer 800 may buffer some clock signals iCK_fA<0:1> of the first preliminary multiphase clock signals iCK_fA<0:1>, iCK_f/2<0:3>, and iCK_f/4<0:3>, and output the buffered signals as multiphase clock signals iCKE<0:1>.

The second buffer 900 buffer some clock signals iCK_4f<0:1> of the second preliminary multiphase clock signals iCK_fB<0:3>, iCK_2f<0:3>, and iCK_4f<0:1>, and output the buffered signals as the multiphase clock signals iCKE<0:1>.

Because the phase clock signals iCK_fA<0:1> and iCK_4f<0:1> are signals each having a 2-phase and can be externally output without passing through the clock multiplexing circuit 200, the phase clock signals iCK_fA<0:1> and iCK_4f<0:1> are output to the outside via only the first buffer 800 and the second buffer 900. Furthermore, because only one of the signals iCK_fA<0:1> and iCK_4f<0:1> is activated according to the mode, the output terminal can be shared.

The fact that the number of clock multiplexers is four in FIG. 6 is only based on the number of signals input to the clock multiplexing circuit 200, and the number of clock multiplexers may vary depending on the number of signals input to the clock multiplexing circuit 200.

Figure 7:
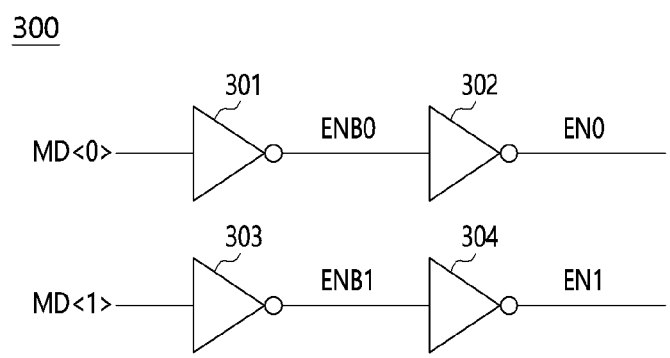
FIG. 7 is a diagram illustrating the configuration of a mode control unit of FIG. 6.

FIG. 7 is a diagram illustrating the configuration of the mode control unit 300 of FIG. 6.

Referring to FIG. 7, the mode control unit 300 may include a plurality of inverters 301 to 304. A first inverter 301 and a second inverter 302 may sequentially invert the mode control signal MD<0> and output the inverted signals as the first enable signals ENB0 and EN0. A third inverter 303 and a fourth inverter 304 may sequentially invert the mode control signal MD<1> and output the inverted signals the second enable signals ENB1 and EN1.

Figure 8:
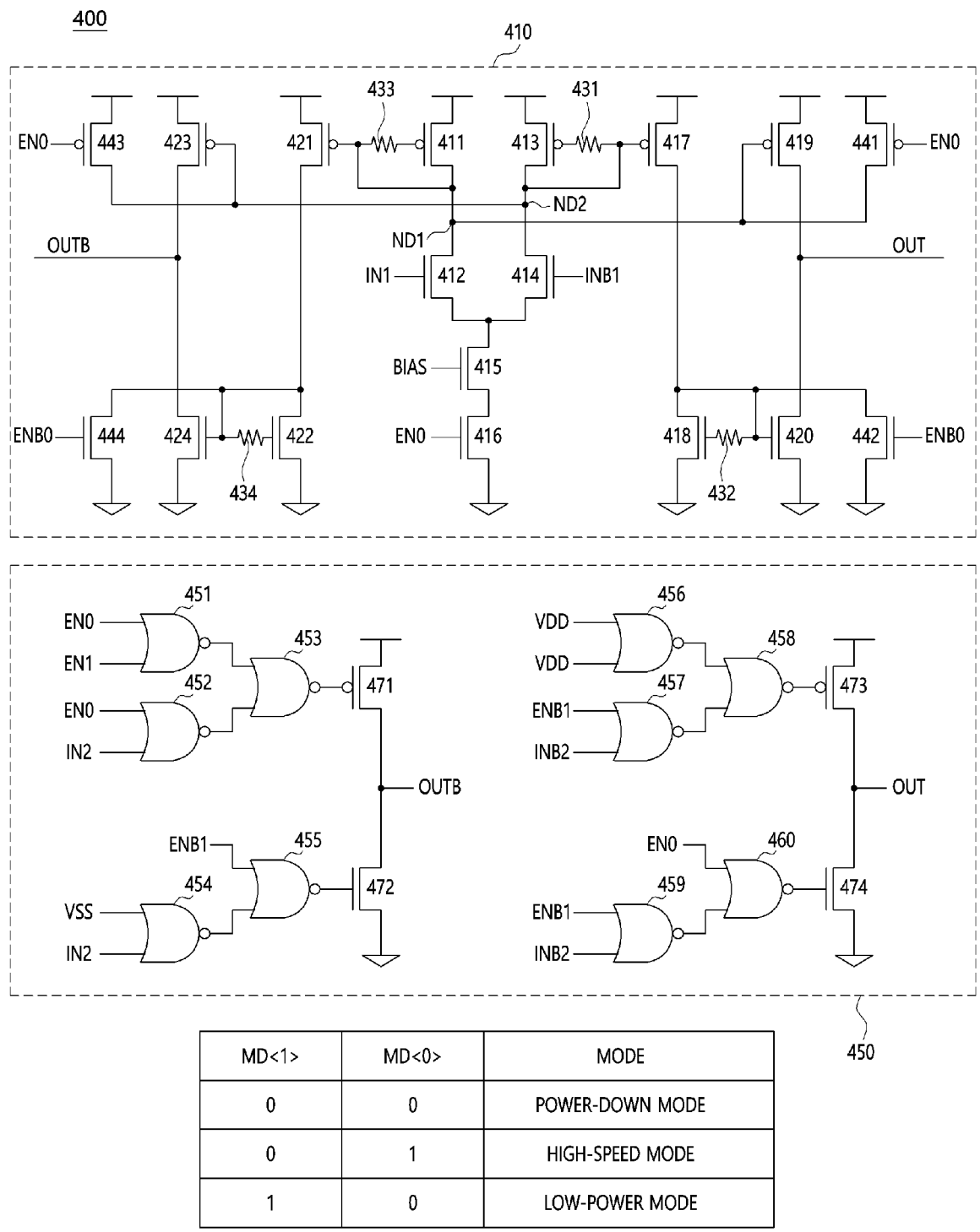
FIG. 8 is a diagram illustrating the configuration of a first clock multiplexer of FIG. 6.

FIG. 8 is a diagram illustrating the configuration of the first clock multiplexer 400 of FIG. 6, and FIG. 9A to FIG. 9C are diagrams for explaining an operation of the first clock multiplexer 400 of FIG. 8 for each mode.

The configuration and operation of the first clock multiplexer 400 are described below with reference to FIG. 8 and FIG. 9A to FIG. 9C.

Referring to FIG. 8, the first clock multiplexer 400 may include a first multiplexing unit 410 and a second multiplexing unit 450.

The first multiplexing unit 410 may convert first input signals IN and INB each having the CML level into CMOS level-signals in response to the first enable signals EN0 and ENB0, and generate output signals OUT/OUTB. Some clock signals iCK_f/2<0, 2> of the first preliminary multiphase clock signals iCK_fA<0:1>, iCK_f/2<0:3>, and iCK_f/4<0:3> may be input as the first input signals IN and INB.

The first multiplexing unit 410 may include a plurality of transistors 411 to 424 and 441 to 444 and a plurality of resistors 431 to 434. The plurality of transistors 411 to 424 and the plurality of resistors 431 to 434 may operate as a differential amplifier. The transistor 415 may adjust the amount of current of the differential amplifier according to a bias voltage BIAS. The transistor 416 may open or block a current path of the differential amplifier according to the first enable signal EN0. The transistors 441 to 444 may control activation of the transistors 419, 420, 423, and 424 for driving the output signals OUT/OUTB in response to the first enable signals EN0 and ENB0.

The second multiplexing unit 450 may buffer and output second input signals IN2 and INB2 in response to the first enable signals EN0 and ENB0 and the second enable signals EN1 and ENB1. Some clock signals iCK_2f<0, 2> of the first preliminary multiphase clock signals iCK_fA<0:1>, iCK_f/2<0:3>, and iCK_f/4<0:3> may be input as the second input signals IN2 and INB2.

The second multiplexing unit 450 may include a plurality of logic gates 451 to 460 and a plurality of transistors 471 to 474. A first logic gate 451 may perform a NOR operation on the first enable signal EN0 and the second enable signal EN1, and output the NOR operation result. A second logic gate 452 may perform a NOR operation of the first enable signal EN0 and the second input signal IN2, and output the NOR operation result. A third logic gate 453 may perform a NOR operation on the output of the first logic gate 451 and the output of the second logic gate 452, and output the NOR operation result. A first transistor 471 may pull up the output signal OUTB to a power supply level according to the output of the third logic gate 453. A fourth logic gate 454 may perform a NOR operation on a ground level VSS and the second input signal IN2, and output the NOR operation result. A fifth logic gate 455 may perform a NOR operation on the second enable signal ENB1 and the output of the fourth logic gate 454, and output the NOR operation result. A second transistor 472 may pull down the output signal OUTB to the ground level according to the output of the fifth logic gate 455. A sixth logic gate 456 may perform a NOR operation on a power supply level VDD and the power supply level VDD, and output the NOR operation result. A seventh logic gate 457 may perform a NOR operation on the second enable signal ENB1 and the second input signal INB2, and output the NOR operation result. An eighth logic gate 458 may perform a NOR operation on the output of the sixth logic gate 456 and the output of the seventh logic gate 457, and output the NOR operation result. A third transistor 473 may pull up the output signal OUT to the power supply level according to the output of the eighth logic gate 458. A ninth logic gate 459 may perform a NOR operation on the second enable signal ENB1 and the second input signal INB2, and output the NOR operation result. A tenth logic gate 460 may perform a NOR operation on the first enable signal EN0 and the output of the ninth logic gate 459, and output the NOR operation result. A fourth transistor 474 may pull down the output signal OUT to the ground level according to the output of the tenth logic gate 460.

Figure 9A:
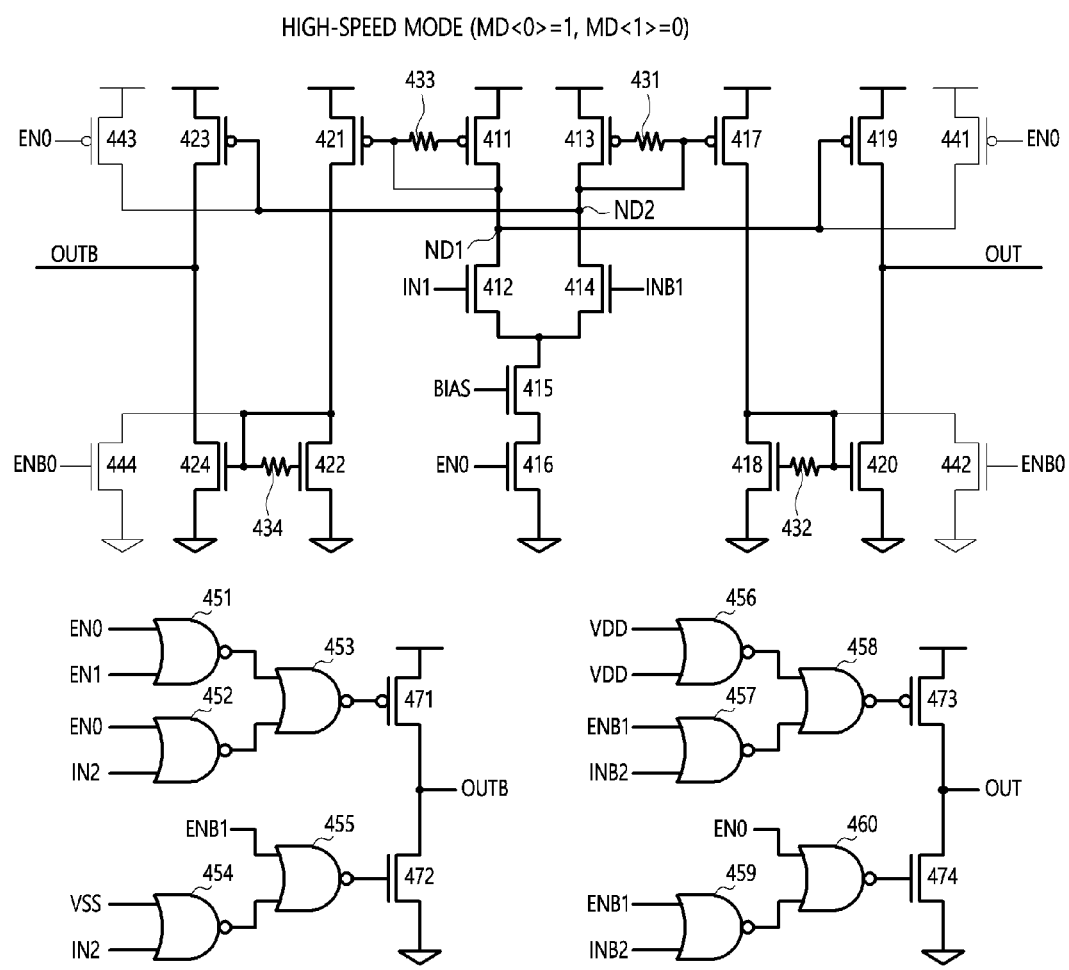
FIGS. 9A, 9B, and FIG. 9C are diagrams for explaining an operation of the first clock multiplexer of FIG. 8 for each mode.

The operation of the first clock multiplexer 400 according to the first mode, that is, the high-speed mode, is described below with reference to FIG. 9A.

In the high-speed mode, the mode control signals MD<0> has a high-level value, the mode control signals MD<1> has a low-level value, the first enable signal EN0 has a high-level value, the first enable signal ENB0 has a low-level value, the second enable signal EN1 has a low-level value, and the second enable signal ENB1 has a high-level value.

Because the first enable signal EN0 has a high-level value and the first enable signal ENB0 has a low-level value, the transistors 441 to 444 of the first multiplexing unit 410 may be deactivated, and circuit configurations indicated by thick lines may be activated. A level difference between the first input signals IN and INB input to the transistors 412 and 414 may be applied to nodes ND1 and ND2, so that the transistors 419, 420, 423, and 424 may operate according to the levels of the nodes ND1 and ND2 to pull-up one of the output signals OUT/OUTB to the CMOS level and to pull-down the other one thereof.

Because first enable signal EN0 has a high-level value and the first enable signal ENB0 has a low-level value, the third logic gate 453 and the eighth logic gate 458 of the second multiplexing unit 450 may output a high level and the fifth logic gate 455 and the tenth logic gate 460 thereof may output a low level, so that all of the transistors 471 to 474 may be turned off.

Figure 9B:
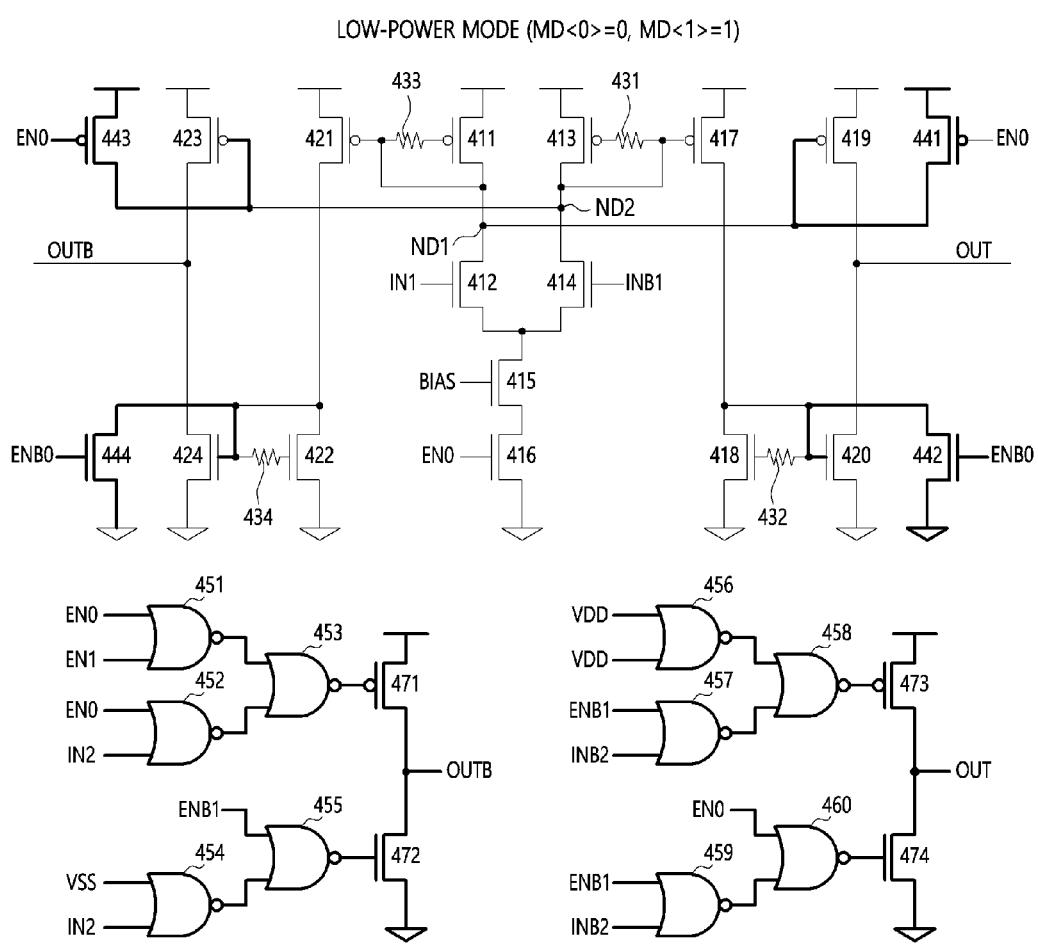

The operation of the first clock multiplexer 400 according to the second mode, that is, the low-power mode is described below with reference to FIG. 9B.

In the low-power mode, the mode control signals MD<0> has a low-level value, the mode control signals MD<1> has a high-level value, the first enable signal EN0 has a low-level value, the first enable signal ENB0 has a high-level value, the second enable signal EN1 has a high-level value, and the second enable signal ENB1 has a low-level value.

Because the first enable signal EN0 has a low-level value, the first enable signal ENB0 has a high-level value, only the transistors 441 to 444 indicated by thick lines in the first multiplexing unit 410 are activated and the transistor 416 blocks the current path of the differential amplifier, so that the other circuit configurations except for the transistors 441 to 444 are deactivated.

On the other hand, because the first enable signal EN0 has a low-level value, the first enable signal ENB0 has a high-level value and the second enable signal EN1 has a high-level value, and the second enable signal ENB1 has a low-level value, the third logic gate 453, the fifth logic gate 455, the eighth logic gate 458, and the tenth logic gate 460 of the second multiplexing unit 450 may pull up one of the output signals OUT/OUTB and pull down the other one thereof according to the logic levels of the second input signals IN2 and INB2.

Figure 9C:
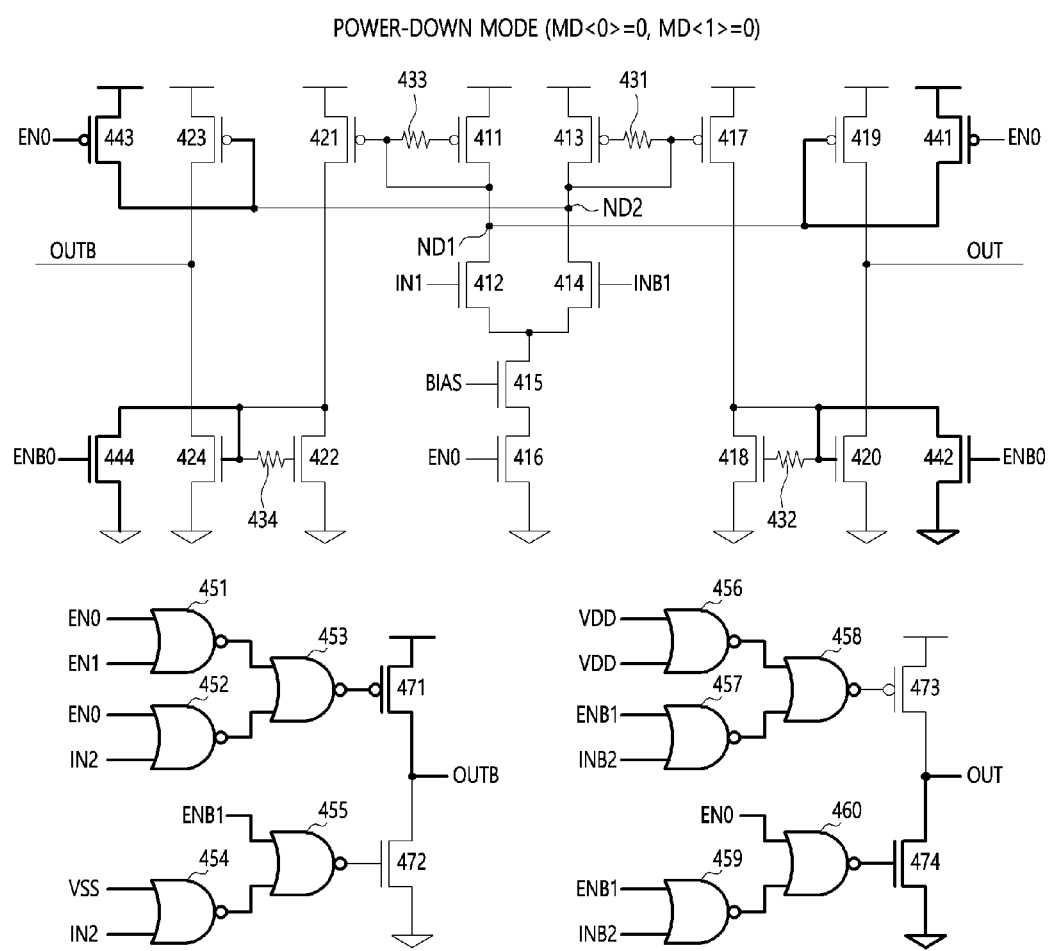

The operation of the first clock multiplexer 400 according to the third mode, that is, the power-down mode, is described below with reference to FIG. 9C.

In the power-down mode, the mode control signals MD<0> has a low-level value, the mode control signals MD<1> has a low-level value, the first enable signal EN0 has a low-level value, the first enable signal ENB0 has a high-level value, the second enable signal EN1 has a low-level value, and the second enable signal ENB1 has a high-level value.

Because the first enable signal EN0 has a low-level value, the first enable signal ENB0 has a high-level value, only the transistors 441 to 444 indicated by thick lines in the first multiplexing unit 410 are activated and the transistor 416 blocks the current path of the differential amplifier, so that the other circuit configurations except for the transistors 441 to 444 are deactivated.

Because the first enable signal EN0 has a low level, the second enable signal EN1 has a low-level value, and the second enable signal ENB1 has a high-level value, the third logic gate 453 and the fifth logic gate 455 of the second multiplexing unit 450 may output a low level, and the eighth logic gate 458 and the tenth logic gate 460 thereof may output a high level. Accordingly, in an embodiment, one OUTB of the output signals OUT/OUTB may be fixed to the power supply level and the other one OUT thereof may be fixed to the ground level regardless of the logic levels of the second input signals IN2 and INB2. Because the second to fourth clock multiplexers 500, 600, and 700 also operate in the same manner as the first clock multiplexer 400, in an embodiment, power consumption of the clock distribution circuit can be minimized in the power-down mode.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. A clock multiplexing circuit comprising:
a mode control unit configured to generate first enable signals and second enable signals in response to mode control signals;
a first multiplexing unit configured to convert first input signals having a current mode logic (CML) level into complementary metal-oxide semiconductor (CMOS) level-signals in response to activation of the first enable signals, and to output the CMOS level-signals; and
a second multiplexing unit configured to buffer and output second input signals having the CMOS level in response to the first enable signals and the second enable signals.

2. The clock multiplexing circuit according to claim 1, wherein, when the mode control signals have a value defining a first mode, the mode control unit is configured to activate the first enable signals and deactivate the second enable signals,
when the mode control signals have a value defining a second mode, the mode control unit is configured to deactivate the first enable signals and activate the second enable signals, and
when the mode control signals have a value defining a third mode, the mode control unit is configured to deactivate the first enable signal and the second enable signal.

3. The clock multiplexing circuit according to claim 1, wherein the second multiplexing unit is configured to set an output terminal of the second multiplexing unit to a predetermined level in response to deactivation of the first enable signals and deactivation of the second enable signals.

4. A clock distribution circuit comprising:
a first clock processing circuit configured to divide and output first external clock signals when mode control signals have a value defining a first mode;
a second clock processing circuit configured to multiply and output the first external clock signals and second external clock signals when the mode control signals have a value defining a second mode; and
a clock multiplexing circuit configured to convert the output of the first clock processing circuit into complementary metal-oxide semiconductor (CMOS) level-signals and output the CMOS level-signals when the mode control signals have the value defining the first mode, and to buffer and output the output of the second clock processing circuit when the mode control signals have the value defining the second mode.

5. The clock distribution circuit according to claim 4, wherein, when the mode control signals have the value defining the first mode, the first external clock signals and the second external clock signals are input as current mode logic (CML)-level signals, and when the mode control signals have the value defining the second mode, the first external clock signals and the second external clock signals are input as CMOS-level signals.

6. The clock distribution circuit according to claim 4, wherein the first clock processing circuit comprises:
an input buffer configured to be activated to receive the first external clock signals when the mode control signals have the value defining the first mode; and
a divider configured to divide an output of the input buffer by at least one magnification.

7. The clock distribution circuit according to claim 6, wherein the divider is configured to divide the output of the input buffer, and invert divided signals to generate first preliminary multiphase clock signals.

8. The clock distribution circuit according to claim 4, wherein the second clock processing circuit comprises:
an input buffer configured to be activated to receive the first external clock signals when the mode control signals have the value defining the second mode; and
a multiplier configured to multiply an output of the input buffer by at least one magnification.

9. The clock distribution circuit according to claim 4, wherein the clock multiplexing circuit comprises:
a mode control unit configured to generate first enable signals and second enable signals in response to the mode control signals;
a first multiplexing unit configured to convert a signal output as CML-level signals by the first clock processing circuit into CMOS level-signals in response to activation of the first enable signals, and to output the CMOS level-signals; and
a second multiplexing unit configured to buffer and output a signal output as CMOS level-signals by the second clock processing circuit, in response to the first enable signals and the second enable signals.

10. A semiconductor apparatus comprising:
a plurality of input and output (input/output) terminals configured to transmit and receive data according to multiphase clock signals;
a global clock distribution circuit configured to convert first preliminary multiphase clock signals, which are generated by dividing first external clock signals, into and output the complementary metal-oxide semiconductor (CMOS) level-signals when mode control signals have a value defining a first mode, and to buffer and output second preliminary multiphase clock signals generated by multiplying the first external clock signals and second external clock signals when the mode control signals have a value defining a second mode; and
a local clock distribution circuit configured to distribute, as the multiphase clock signals, the first preliminary multiphase clock signals and the second preliminary multiphase clock signals to the plurality of input/output terminals.

11. The semiconductor apparatus according to claim 10, wherein, when the mode control signals have the value defining the first mode, the first external clock signals and the second external clock signals are input as current mode logic (CML)-level signals from an outside of the semiconductor apparatus, and when the mode control signals have the value defining the second mode, the first external clock signals and the second external clock signals are input at CMOS level-signals from the outside of the semiconductor apparatus.

12. The semiconductor apparatus according to claim 10, wherein the global clock distribution circuit is configured to be deactivated when the mode control signals have a value defining a third mode.

13. The semiconductor apparatus according to claim 10, wherein the global clock distribution circuit comprises:
a first clock processing circuit configured to generate the first preliminary multiphase clock signals by dividing the first external clock signals when the mode control signals have the value defining the first mode;

a second clock processing circuit configured to generate the second preliminary multiphase clock signals by multiplying the first external clock signals and the second external clock signals when the mode control signals have the value defining the second mode;

a mode control unit configured to generate first enable signals and second enable signals in response to the mode control signals;

a first multiplexing unit configured to convert the first preliminary multiphase clock signals into CMOS level-signals in response to activation of the first enable signals, and to output the CMOS level-signals; and a second multiplexing unit configured to buffer and output the second preliminary multiphase clock signals in response to the first enable signals and the second enable signals.

14. The semiconductor apparatus according to claim 13, wherein the first clock processing circuit comprises:

an input buffer configured to be activated to receive the first external clock signals when the mode control signals have the value defining the first mode; and a divider configured to divide output of the input buffer by at least one magnification and invert the divided signals to generate the first preliminary multiphase clock signals.

15. The semiconductor apparatus according to claim 13, wherein the second clock processing circuit comprises:

an input buffer configured to be activated to receive the first external clock signals when the mode control signals have the value defining the second mode; and a multiplier configured to generate the second preliminary multiphase clock signals by multiplying an output of the input buffer by at least one magnification.

16. The semiconductor apparatus according to claim 13, wherein the second multiplexing unit is configured to set an output terminal of the second multiplexing unit to a predetermined level in response to deactivation of the first enable signals and deactivation of the second enable signals.

\* \* \* \* \*